United States Patent [19]
Hayes

[11] Patent Number: 5,477,183
[45] Date of Patent: Dec. 19, 1995

[54] AUTOMATIC GAIN AND LEVEL CONTROL CIRCUIT AND METHOD

[75] Inventor: Robert S. Hayes, Lawndale, Calif.

[73] Assignee: Hughes Aircraft Company, Los Angeles, Calif.

[21] Appl. No.: 271,600

[22] Filed: Jul. 7, 1994

[51] Int. Cl.[6] .................................................. G05F 1/44
[52] U.S. Cl. ...................... 327/306; 327/331; 327/332; 327/307; 330/278; 348/255
[58] Field of Search .................................. 330/278, 279, 330/133, 134, 9; 327/78, 77, 306, 307, 308, 312, 315, 331, 332, 336, 309, 316; 348/255; 358/446

[56] References Cited

U.S. PATENT DOCUMENTS

| | | | |
|---|---|---|---|
| 3,699,948 | 10/1972 | Ota et al. ................................. | 327/307 |
| 4,103,243 | 7/1978 | Orban ....................................... | 327/311 |
| 4,525,741 | 6/1985 | Chahal et al. ........................... | 348/255 |
| 4,625,240 | 11/1986 | Yablonski et al. ....................... | 348/484 |
| 5,218,320 | 6/1993 | Albouy et al. ........................... | 330/259 |

*Primary Examiner*—Timothy P. Callahan
*Assistant Examiner*—Dinh T. Le
*Attorney, Agent, or Firm*—M. W. Sales; W. K. Denson-Low

[57] ABSTRACT

An automatic gain and level control method and circuit. In general, the inventive method includes the steps of detecting the DC level of a signal and providing a first signal in response thereto and detecting the AC amplitude or gain of the signal and providing a second signal in response thereto. A DC level error signal is generated in response to the first signal. An AC amplitude error signal is generated in response to the second signal. The DC level of the signal is corrected in response to the DC level error signal. The AC amplitude of the signal is corrected in response to the AC amplitude error signal.

9 Claims, 1 Drawing Sheet

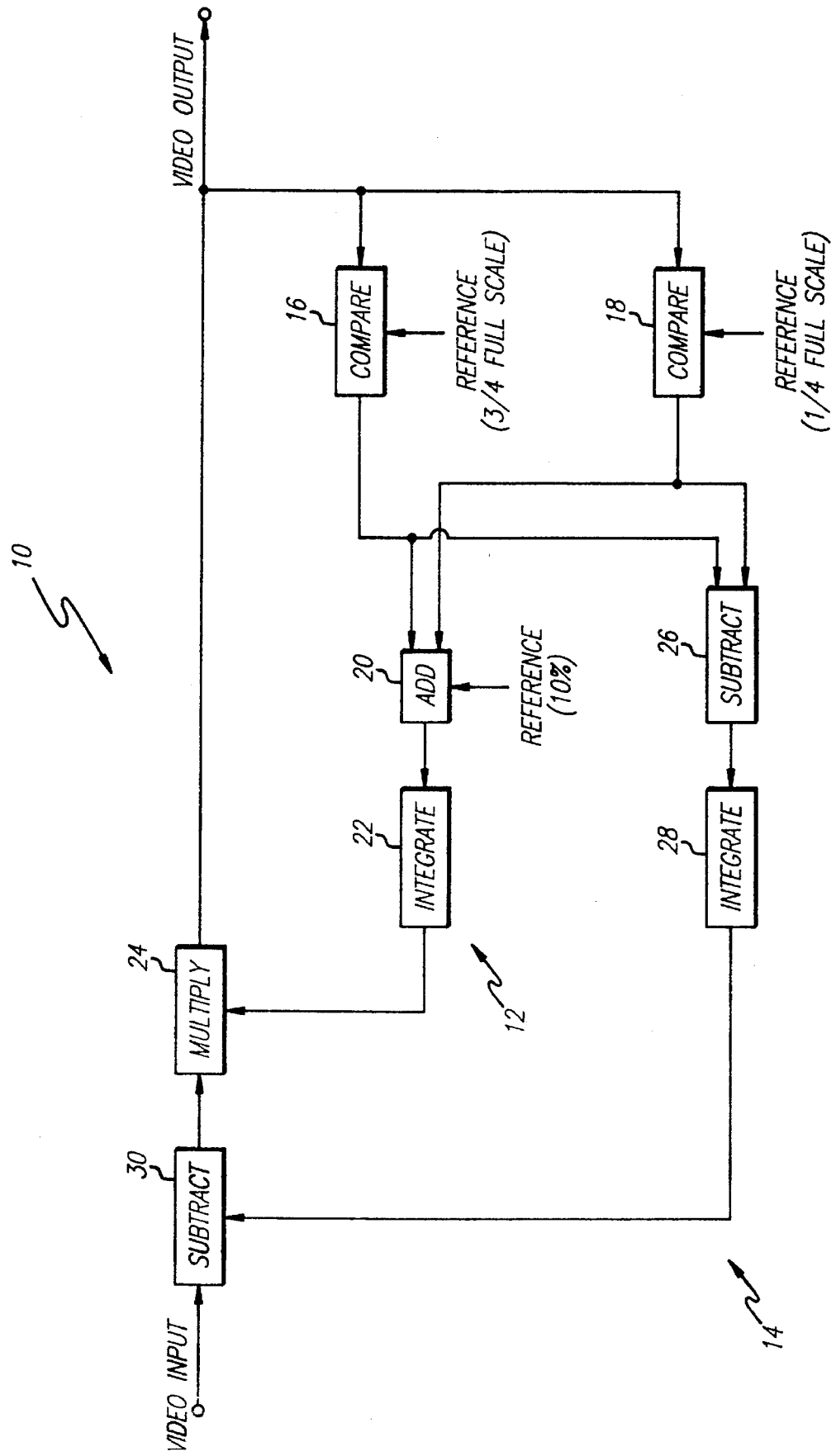

AUTOMATIC GAIN AND LEVEL CONTROL CIRCUIT AND METHOD

BACKGROUND OF THE INVENTION

1. Field of the Invention

The present invention relates to signal processing circuits and systems. More specifically, the present invention relates to circuits and systems for providing automatic gain and offset control.

2. Description of the Related Art

Certain circuits, particularly analog-to-digital converters, require input signals which are centered within a predetermined range. This is problematic with respect to visible and infrared video systems where input signal levels may vary due to a variety of factors. In these systems, the input signal should be symmetrical to fully utilize the entire dynamic range of the system. This is achieved, in many cases, by AC coupling the input signal. While, for these systems, the average signal levels are centered, gain control must still be effected.

Gain and level (or offset) control may be achieved by manual adjustment whenever the input signal changes. However, this solution has been found to be unacceptable in some applications inasmuch as it requires operator attention and skill, operator controls and wiring for same.

Previous automatic gain control systems sensed peak levels or average levels. Using peak levels allows a small number of extreme signal samples or picture elements to reduce the gain of the majority of the samples, resulting in a low contrast image. A system based on average signal levels may allow a substantial number of picture elements to exceed the dynamic range of the system, resulting in lost information.

Thus, a need remains in the art for a circuit or system for automatically adjusting the gain and level of signals input to or output from an electronic circuit.

SUMMARY OF THE INVENTION

The need in the art is addressed by the present invention which provides an automatic gain and level control method and circuit. In general, the inventive method includes the steps of detecting the DC level of a signal and providing a first signal in response thereto and detecting the AC amplitude or gain of the signal and providing a second signal in response thereto. A DC level error signal is generated in response to the first signal. An AC amplitude error signal is generated in response to the second signal. The DC level of the signal is corrected in response to the DC level error signal. The AC amplitude of the signal is corrected in response to the AC amplitude error signal.

In a specific implementation the invention includes two feedback loops, one which adjusts the gain and one which adjusts the offset. Each feedback loop contains a low pass filter or integrator which generates the correction signals. The offset correction is added to the signal to be corrected and the result is corrected for gain using a variable gain amplifier or multiplier. The corrected signal is compared to two thresholds near the upper and lower end of the desired dynamic range. The outputs of the comparators are two digital signals, one representing the time the output signal is above the upper threshold and the other representing the time the signal is below the lower threshold.

The offset correction signal is derived by subtracting the two digital signals and filtering or integrating the result. The filter or integrator output is an analog signal which represents unbalance in the fraction of the time a signal is above the upper threshold compared to the time the signal is below the lower threshold. These time periods are forced to be equal by using the output of the integrator to control the offset added to the original video signal.

The gain correction signal is derived by adding the two digital signals together. This signal represents the fraction of time that the output signal is not between the two thresholds. This time period is forced to be a fixed percentage by integrating the difference between this signal and a reference voltage and using the integrator output to control the gain multiplying the input signal.

BRIEF DESCRIPTION OF THE DRAWINGS

The Figure is a simplified block diagram of a circuit implemented in accordance with the teachings of the present invention.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The Figure is a simplified block diagram of a circuit implemented in accordance with the teachings of the present invention. The inventive circuit 10 includes first and second feedback loops 12 and 14. The first feedback loop 12 adjusts the gain and the second feedback loop 14 adjusts the offset. The signal to be adjusted is fed to first and second comparators 16 and 18. The first comparator 16 has a reference at ¾ of the desired dynamic range. The second comparator 18 has a reference at ¼ of the desired dynamic range. Thus, the corrected signal is compared to two thresholds near the upper and lower end of the desired dynamic range. The outputs of the comparators are two digital signals, one representing the time the output signal is above the upper threshold and the other representing the time the signal is below the lower threshold.

A gain correction signal is derived by adding the two digital signals together in an adder 20. This signal represents the fraction of time that the output signal is not between the two thresholds. This time period is forced to be a fixed percentage by integrating the difference between this signal and a reference voltage and using the integrator output to control the gain multiplying the input signal. Thus, the adder 20 compares the combined signals to a reference at 10% of the desired dynamic range and provides an output signal which represents the difference therebetween. The difference signal is integrated by a first integrator 22 to provide an AC gain error (correction) signal. The gain correction signal is input to a multiplier 24 which corrects the gain of the input signal accordingly. The multiplier 24 may be implemented with a multiplying digital to analog converter (DAC). In this case, the output of the first integrator 22 provides a reference for the multiplying DAC.

The offset correction signal is derived by subtracting the two digital signals in a subtractor 26 and filtering or integrating the result in a second integrator 28. The integrator output is an analog signal which represents unbalance in the fraction of the time the input signal is above the upper threshold compared to the time the signal is below the lower threshold. These time periods are forced to be equal by using the output of the second integrator 28 to control the offset added to the original video signal by a second subtractor 30. That is, the second integrator 28 provides a DC offset error (correction) signal.

The thresholds can be set by either analog or digital methods. If the output signal is being digitized, two or more of the most significant bits can be examined to set a threshold. For example, if both most significant bits are ones, the signal is above ¾ of full scale. If both bits are zeroes, the signal is below ¼ of full scale. Three bits can be used to set thresholds at ⅞ and ⅛ of full scale.

The digital signals can be gated to make the circuit insensitive to periods when the video signal does not have useful content. Examples of such periods are scanner turn around times, detector reset periods, or sync and blanking intervals.

With reference levels set as shown in the Figure, 90% of the output pixels will fall between ¼ and ¾ of dynamic, 5% of the pixels will be above ¾ of dynamic, and 5% of the output pixels will be below ¼ of full scale.

The circuit 10 may be used as an input circuit for another circuit such as an analog to digital converter as well as an output circuit as shown above. When used as an input circuit, the comparators may be implemented digitally by simply examining the codes output by the analog to digital converter. The comparators, adders, subtractors, integrators, and multiplier may be standard components well known to those skilled in the art and specifically chosen depending on the particular application.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. A circuit for automatically correcting the offset and gain for a video input signal within a dynamic range of said video input signal comprising:

Means for subtracting an offset correction signal from said video input signal to provide an offset video signal;

Means for multiplying said offset video signal using a gain correction signal to provide a video output signal;

First comparator means for comparing said video output signal to an upper threshold, which is a first fraction of the dynamic range, to provide a first signal indicative of whether said video signal is above said upper threshold;

Second comparator means for comparing said video output signal to a lower threshold, which is a second fraction of the dynamic range, to provide a second signal indicative of whether said video signal is below said lower threshold;

Offset feedback loop means coupled to said first and second comparator means for receiving said first and second signals to provide said offset correction signal; and Gain feedback loop means coupled to said first and second comparator means for receiving said first and second signals to provide said gain correction signal.

2. The invention of claim 1 wherein said upper threshold has a value of about ¾ of the desired dynamic range.

3. The invention of claim 1 wherein said lower threshold has a value of about ¼ of the desired dynamic range.

4. The invention of claim 1 wherein said offset feedback loop includes a means for subtracting said second signal from said first signal to provide an offset signal.

5. The invention of claim 4 including a means for integrating said offset signal to produce an offset correction signal indicative of the time said video output signal is above said upper threshold compared to the time said video output signal is below said lower threshold.

6. The invention of claim 5 wherein said gain feedback loop includes a means for adding said first signal to said second signal to provide a sum signal and means for subtracting said sum signal from a reference voltage to provide a gain signal.

7. The invention of claim 6 including a means for integrating said gain signal to provide a gain correction signal indicative of the time that the video signal is above said upper threshold or below said lower threshold.

8. The invention of claim 6 wherein said reference voltage is set at about 10% of the desired full scale range.

9. A method for automatically correcting the offset and gain for a video input signal including the steps of:

Subtracting an offset correction signal from a video input signal to provide an offset video signal;

Multiplying said offset video signal using a gain correction signal to provide a video output signal;

Comparing said video output signal to an upper threshold to provide a first signal indicative of whether said video signal is above said upper threshold;

Comparing said video output signal to a lower threshold to provide a second signal indicative of whether said video signal is below said lower threshold;

Receiving said first and second signals in an offset feedback loop to provide said offset correction signal; and Receiving said first and second signals in a gain feedback loop to provide said gain correction signal.

* * * * *